(12) United States Patent
Nakano

(10) Patent No.: US 6,748,199 B2
(45) Date of Patent: Jun. 8, 2004

(54) PORTABLE TELEPHONE APPARATUS AND STABLLY SUPPLYING METHOD OF REFERENCE FREQUENCY

(75) Inventor: Akihiro Nakano, Tokyo (JP)

(73) Assignee: NEC Corporation, Toyko (JP)

(*) Notice: Subject to any disclaimer, the term of this patent is extended or adjusted under 35 U.S.C. 154(b) by 625 days.

(21) Appl. No.: 09/764,054

(22) Filed: Jan. 19, 2001

(65) Prior Publication Data
US 2001/0014590 A1 Aug. 16, 2001

(30) Foreign Application Priority Data

Jan. 19, 2000 (JP) ..................................... 2000-009698

(51) Int. Cl.$^7$ ................................................ H04B 1/18
(52) U.S. Cl. ........................ 455/192.2; 455/75; 455/76; 455/192.1; 455/256
(58) Field of Search ............................ 455/75, 76, 119, 455/255–260, 264–265, 192.1, 192.2, 192.3; 375/356, 357

(56) References Cited

U.S. PATENT DOCUMENTS

| | | | | |
|---|---|---|---|---|
| 4,317,221 A | * | 2/1982 | Toya | 455/76 |
| 5,335,348 A | * | 8/1994 | Kono | 455/192.2 |
| 5,493,710 A | * | 2/1996 | Takahara et al. | 455/192.2 |
| 5,844,435 A | * | 12/1998 | Grundvig | 327/151 |
| 6,029,061 A | * | 2/2000 | Kohlschmidt | 455/574 |
| 6,112,068 A | * | 8/2000 | Smith et al. | 455/260 |
| 6,148,187 A | * | 11/2000 | Chiba | 455/192.2 |
| 6,271,731 B2 | * | 8/2001 | Koszarsky | 331/36 C |

* cited by examiner

*Primary Examiner*—Vivian Chin
*Assistant Examiner*—Tuan Tran
(74) *Attorney, Agent, or Firm*—McGinn & Gibb, PLLC

(57) ABSTRACT

A portable telephone apparatus includes a reference frequency generating section capable of suitably changing frequency accuracy of an output signal in accordance with an input control voltage, and a high-accurate reference frequency generating section having accuracy for a temperature change extremely higher than that of the reference frequency generating section and in which output frequency accuracy thereof changes only within a range of prescribed values. A determination device determines whether or not frequency accuracy of an output signal from the reference frequency generating section meets the prescribed value. A selector selects an output signal from the reference frequency generating section in a case that a determination result of the determination device meets the prescribed value, and selects an output signal from the high-accurate reference frequency generating section in a case that a determination result of the determination device does not meet the prescribed value.

17 Claims, 12 Drawing Sheets

FIG. 5

FREQUENCY ACCURACY OF OUTPUT SIGNAL FROM REFERENCE FREQUENCY
GENERATING SECTION AFTER AFC OPERATION IS OK

| OPERATING CONDITION | OSC 1 | OSC 2 | SELECTOR | NOTES |
|---|---|---|---|---|
| BEFORE START OF AFC | ON | OFF | OSC 1 | |
| COMPLETION OF AFC | ON | OFF | OSC 1 | |
| START OF DETERMINATION | ON | ON | OSC 1 | |
| COMPLETION OF DETERMINATION | ON | OFF | OSC 1 | FREQUENCY ACCURACY OF OSC1 IS OK |

FREQUENCY ACCURACY OF OUTPUT SIGNAL FROM REFERENCE FREQUENCY
GENERATING SECTION AFTER AFC OPERATION IS NG

| OPERATING CONDITION | OSC 1 | OSC 2 | SELECTOR | NOTES |
|---|---|---|---|---|
| BEFORE START OF AFC | ON | OFF | OSC 1 | |
| COMPLETION OF AFC | ON | OFF | OSC 1 | |
| START OF DETERMINATION | ON | ON | OSC 1 | |
| COMPLETION OF DETERMINATION | OFF | ON | OSC 2 | FREQUENCY ACCURACY OF OSC1 IS NG |

OSC1: REFERENCE FREQUENCY GENERATING SECTION 10
OSC2: HIGH-ACCURATE REFERENCE FREQUENCY GENERATING SECTION 13

OUTPUT SIGNAL FROM REFERENCE FREQUENCY GENERATING
SECTION 10 IS IN USE FOR REFERENCE FREQUENCY

FIG. 6

FREQUENCY ACCURACY OF OUTPUT SIGNAL FROM REFERENCE FREQUENCY
GENERATING SECTION AFTER AFC OPERATION IS OK

| OPERATING CONDITION | OSC 1 | OSC 2 | SELECTOR | NOTES |
|---|---|---|---|---|
| BEFORE START OF AFC | OFF | ON | OSC 2 | |
| COMPLETION OF AFC | ON | ON | OSC 2 | |
| START OF DETERMINATION | ON | ON | OSC 2 | |
| COMPLETION OF DETERMINATION | ON | OFF | OSC 1 | FREQUENCY ACCURACY OF OSC1 IS OK |

FREQUENCY ACCURACY OF OUTPUT SIGNAL FROM REFERENCE FREQUENCY
GENERATING SECTION AFTER AFC OPERATION IS NG

| OPERATING CONDITION | OSC 1 | OSC 2 | SELECTOR | NOTES |
|---|---|---|---|---|
| BEFORE START OF AFC | OFF | ON | OSC 2 | |
| COMPLETION OF AFC | ON | ON | OSC 2 | |
| START OF DETERMINATION | ON | ON | OSC 2 | |
| COMPLETION OF DETERMINATION | OFF | ON | OSC 2 | FREQUENCY ACCURACY OF OSC1 IS NG |

OSC1: REFERENCE FREQUENCY GENERATING SECTION 10
OSC2: HIGH-ACCURATE REFERENCE FREQUENCY GENERATING SECTION 13

OUTPUT SIGNAL FROM HIGH-ACCURATE REFERENCE FREQUENCY
GENERATING SECTION 13 IS IN USE FOR REFERENCE FREQUENCY

PORTABLE TELEPHONE APPARATUS AND STABLLY SUPPLYING METHOD OF REFERENCE FREQUENCY

BACKGROUND OF THE INVENTION

The present invention relates to a portable telephone apparatus, and particularly to a portable telephone apparatus of a mobile communication system, in which a frequency transmitted and received on a radio channel is determined based on a changeable reference frequency, and information such as voice is modulated and demodulated, and is transmitted and received between a plurality of base stations via the above-described radio channel.

As shown in FIG. 12, this kind of conventional digital portable telephone apparatus is constructed of a common use section 101, a reception section 102, a transmission section 103, a frequency generating section 104, a reference frequency generating section 105, an AFC section 106, a modulation and demodulation section 107, a control section 108, an operation section 109, a display section 110, and a transceiver 111.

A signal (carrier wave signal) on a radio channel, which was received by the common use section 101 via an antenna, is delivered to the reception section 102, and is mixed with a station issue signal, and is replaced by an intermediate frequency signal, and further, is supplied to the modulation and demodulation section 107 and the AFC section 106. The intermediate frequency signal supplied from the reception section 102 is demodulated in the modulation and demodulation section 107, and is output as a voice signal from the transceiver 111 through the control section 108.

On the other hand, the voice that was input to the transceiver 111 passes the control section 108, and is digitally modulated in the modulation and demodulation section 107, and is converted into a signal (carrier wave signal) on a radio channel in the transmission section 103, and after amplified, is supplied to the common use section 101 and is transmitted.

Further, the operation section 109 and the display section 110, which provide convenience for conducting a call, are connected to the control section 108.

A reference frequency signal from the reference frequency generating section 105 is supplied to the frequency generating section 104, and it generates a station issue signal with accuracy equivalent to frequency accuracy of the reference frequency signal by means of a PLL, and supplies it to the reception section 102 and the transmission section 103.

It is required that the reference frequency generating section 105 outputs a frequency that is stable within a certain range. However, since it is also required that the portable telephone apparatus becomes to be small-sized, light and cheap, it is not possible to increase accuracy and stability of an output frequency from the reference frequency generating section 105 so much. Accordingly, a frequency of the station issue signal can be also changed easily, and transmission and reception cannot be sometimes conducted at a desired frequency on the radio channel.

On the other hand, since output frequency accuracy and stability of the reference frequency generating means in each base station of a digital mobile communication system are extremely high, with regard to a carrier wave signal transmitted and received on a radio channel, a frequency deviation from a prescribed frequency can be extremely reduced.

In addition, quantities of the deviation are slightly different from each other for every base station. Therefore, on a side of the digital portable telephone apparatus, it is necessary to make a frequency deviation in transmission and reception of the apparatus coincide with a frequency deviation of a carrier wave signal of a base station to be connected, that is to say, a frequency deviation of an intermediate frequency signal corresponding thereto, and AFC (Automatic Frequency Control) is conducted for a reference frequency of the apparatus.

In the AFC control in a prior art, first, the AFC section 106 sends one determined initial control signal to the reference frequency generating section 105, and the reference frequency generating section 105 generates a frequency for a value of the provided initial control signal. The AFC section 106 changes a value of the control signal so as to coincide with a frequency deviation of the intermediate frequency signal supplied from the reception section 102, and controls the reference frequency generating section 105.

However, if the above-mentioned AFC control is conducted in a state where reception electric field condition is not good, there is a case in which a frequency of the reference frequency generating section does not exactly coincide with a frequency deviation of a base station. The reason thereof is because, in condition where a reception electric field is low, due to an effect of phasing, an intermediate frequency signal supplied to the AFC section has a lot of phase noises and frequency counting cannot be exactly conducted, and frequency comparison is mistaken. Similarly, if the AFC control is conducted in a state where reception quality condition is not good, there is a case in which a frequency of the reference frequency generating section does not exactly coincide with a frequency deviation of a base station. The reason thereof is because, in condition where reception quality is bad due to an interference disturbance wave and so forth, the disturbance wave is superimposed on an intermediate frequency signal supplied to the AFC section, and thereby, frequency counting cannot be exactly conducted, and frequency comparison is mistaken.

Although there is means for always operating the AFC control as means for solving these tasks, since a consumption electric current becomes to be large, it is not preferable for a digital portable telephone apparatus in which a battery is used for a power supply.

Also, it is known that control of the reference frequency generating section is significantly influenced by heat. In the portable telephone apparatus, since external environment temperature changes suddenly with movement, and the transmission section generates extreme heat during calling, a temperature changing range becomes to be broad. Accordingly, high stability is required for the reference frequency generating section over a wide range even for a temperature change.

Although, as a method for solving this task, to use a reference frequency generating device is considered, which has high stability over a wide range even for a temperature change, and can conduct voltage control, a frequency generating section that meets both conditions is not general one.

SUMMARY OF THE INVENTION

The present invention is made to solve the above-mentioned problems.

Moreover, the objective of the invention is to provide a portable telephone apparatus capable of preventing increase of a consumption electric current without continuously conducting AFC control and keeping communication condition good even though heat influence exists.

The present invention for accomplishing the above-described objective is a portable telephone apparatus characterized in that the apparatus comprises:

reference frequency generating means capable of changing an output frequency for communication with a base station by means of a voltage control signal;

high-accurate reference frequency generating means in which frequency accuracy always meets a prescribed value;

determination means for determining whether or not frequency accuracy of an output signal from the above-described reference frequency generating means meets a predetermined prescribed value; and selection means for selecting an output signal from the above-described reference frequency generating means in case that a determination result of the above-described determination means meets the above-described prescribed value, and for selecting an output signal from the above-described high-accurate reference frequency generating means in case that a determination result of the above-described determination means does not meet the above-described prescribed value.

In addition, it is preferable that an output signal from the above-described reference frequency generating means, which is used for the above-described determination, is an output signal after an AFC operation of the above-described reference frequency generating means.

In the present invention, with regard to a reference frequency output from the reference frequency generating section means inside the portable telephone, which influences a transmission and reception characteristic, in case that frequency accuracy of the reference frequency does not meet the prescribed value (frequency accuracy within a range in which the portable telephone can conduct transmission and reception) due to a frequency shift of the reference frequency by means of heat, failure of the AFC operation and so forth, it becomes to be possible to stably supply the reference frequency by switching the reference frequency to the output signal from the high-accurate reference frequency generating means.

Accordingly, the present invention has a feature that, even though heat influence exists due to long-time calling and so forth, a transmission and reception characteristic can be kept good.

Also, in the above-described present invention, if a power supply of the above-described high-accurate reference frequency generating means is turned off other than a time period during which an output signal from the above-described high-accurate reference frequency generating means is used for a reference frequency, and the apparatus further comprises power supply controlling means for turning off a power supply of the above-described reference frequency generating means other than a time period during which an output signal that is used for determination is generated in case that an output signal from the above-described high-accurate reference frequency generating means is used for a reference frequency, consumption power can be saved.

The present invention for accomplishing the above-described objective is a portable telephone apparatus characterized in that the apparatus comprises:

reference frequency generating means capable of changing an output frequency for communication with a base station by means of a voltage control signal;

high-accurate reference frequency generating means in which frequency accuracy always meets a prescribed value;

comparison means for comparing an output signal after an AFC operation of the above-described reference frequency generating means with an output signal from the above-described high-accurate reference frequency generating means;

determination means for determining whether or not frequency accuracy of an output signal after an AFC operation of the above-described reference frequency generating means meets a predetermined prescribed value, based on a comparison result of the above-described comparison means;

selection means for selecting an output signal from the above-described reference frequency generating means in case that a determination result of the above-described determination means meets the above-described prescribed value, and for selecting an output signal from the above-described high-accurate reference frequency generating means in case that a determination result of the above-described determination means does not meet the above-described prescribed value; and power supply controlling means for turning off a power supply of the above-described high-accurate reference frequency generating means in case that an output signal from the above-described high-accurate reference frequency generating means is used for a reference frequency and other than a case in which an output signal from the above-described high-accurate reference frequency generating means is used in the above-described comparison, and for turning off a power supply of the above-described reference frequency generating means in case that an output signal from the above-described high-accurate reference frequency generating means is used for a reference frequency and other than a time period during which an AFC operation is conducted.

Also, in the above-described present invention, the apparatus further comprises:

RSSI measuring means for measuring RSSI based on a reception signal; and

RSSI comparison means for storing a predetermined RSSI threshold value in advance, and comparing the above-described RSSI threshold value with an RSSI measurement value measured by the above-described RSSI measuring means, and the above-described determination means is constructed so as to conduct determination in case that, with regard to a comparison result of the above-described RSSI comparison means, the above-described RSSI measurement value is smaller than the above-described RSSI threshold value, and an output signal from the above-described reference frequency generating means is used for a reference frequency, and in case that the above-described RSSI measurement value is larger than the above-described RSSI threshold value, and an output signal from the above-described high-accurate reference frequency generating means is used for a reference frequency, and thereby, since the number of comparing the output signal from the above-described reference frequency generating means with the output signal from the above-described high-accurate reference frequency generating means is decreased, consumption power can be further saved.

Also, in the above-described present invention, the apparatus further comprises:

measurement means for measuring reception quality of a reception signal; and reception quality comparison means for storing predetermined reception quality in advance, and comparing the above-described reception quality with reception quality measured by the above-described measurement means, and the above-described determination means is constructed so as to conduct determination in case that, with regard to a comparison result of the above-described reception quality comparison means, reception quality measured by the above-described measurement means is worse than the above-described reception quality stored in advance, and an output signal from the above-described reference frequency generating means is used for a reference frequency, and in case that reception quality measured by the above-described measurement means is better than the above-described reception quality stored in advance, and an output signal from the high-accurate reference frequency generating means is used for a reference frequency, and thereby, since the number of comparing the output signal from the above-described reference frequency generating means with the output signal from the above-described high-accurate reference frequency generating means is decreased, consumption power can be further saved.

The present invention for accomplishing the above-described objective is a stably supplying method of a reference frequency in a portable telephone apparatus characterized in that the method comprises steps of:

providing reference frequency generating means capable of changing an output frequency for communication with a base station by means of a voltage control signal, and high-accurate reference frequency generating means in which frequency accuracy always meets a prescribed value;

determining whether or not frequency accuracy of an output signal from the above-described reference frequency generating means meets a predetermined prescribed value; and selecting an output signal from the above-described reference frequency generating means in case that a result of the above-described determination meets the above-described prescribed value, and for selecting an output signal from the above-described high-accurate reference frequency generating means in case that a determination result of the above-described determination means does not meet the above-described prescribed value.

In addition, it is preferable that an output signal from the above-described reference frequency generating means, which is used for the above-described determination, is an output signal after an AFC operation of the above-described reference frequency generating means.

Also, it is preferable that the method comprises steps of:

turning off a power supply of the above-described high-accurate reference frequency generating means other than a time period during which an output signal from the above-described high-accurate reference frequency generating means is used for a reference frequency; and turning off a power supply of the above-described reference frequency generating means other than a time period during which an output signal that is used for determination is generated in case that an output signal from the above-described high-accurate reference frequency generating means is used for a reference frequency.

The present invention for accomplishing the above-described objective is a stably supplying method of a reference frequency in a portable telephone apparatus characterized in that the method comprises steps of:

providing reference frequency generating means capable of changing an output frequency for communication with a base station by means of a voltage control signal, and high-accurate reference frequency generating means in which frequency accuracy always meets a prescribed value;

comparing an output signal after an AFC operation of the above-described reference frequency generating means with an output signal from the above-described high-accurate reference frequency generating means;

determining whether or not frequency accuracy of an output signal after an AFC operation of the above-described reference frequency generating means meets a predetermined prescribed value, based on a result of the above-described comparison;

selecting an output signal from the above-described reference frequency generating means in case that a result of the above-described determination meets the above-described prescribed value, and selecting an output signal from the above-described high-accurate reference frequency generating means in case that a determination result of the above-described determination means does not meet the above-described prescribed value;

turning off a power supply of the above-described high-accurate reference frequency generating means in case that an output signal from the above-described high-accurate reference frequency generating means is used for a reference frequency and other than a case in which an output signal from the above-described high-accurate reference frequency generating means is used in the above-described comparison; and turning off a power supply of the above-described reference frequency generating means in case that an output signal from the above-described high-accurate reference frequency generating means is used for a reference frequency and other than a time period during which an AFC operation is conducted.

Also, in the above-described present invention, it is further preferable that the method further comprises steps of:

measuring RSSI based on a reception signal; and comparing a predetermined RSSI threshold value stored in advance with the above-described measured RSSI measurement value, and the above-described step of determining whether or not the above-described predetermined prescribed value is met and steps subsequent to this step are conducted only in case that, with regard to a comparison result of the above-described RSSI, the above-described RSSI measurement value is smaller than the above-described RSSI threshold value, and an output signal from the above-described reference frequency generating means is used for a reference frequency, and in case that the above-described RSSI measurement value is larger than the above-described RSSI threshold value, and an output signal from the high-accurate reference frequency generating means is used for a reference frequency.

Also, in the above-described present invention, it is further preferable that the method further comprises steps of:

measuring reception quality of a reception signal; and comparing reception quality stored in advance with the above-described measured reception quality, and the above-described step of determining whether or not the above-described predetermined prescribed value is met and steps subsequent to this step are conducted only in case that, with regard to a comparison result of the above-described reception quality, the above-described measured reception quality is worse than the above-described reception quality stored in advance, and an output signal from the above-described reference frequency generating means is used for a reference frequency, and in case that the above-described measured reception quality is better than the above-described reception quality stored in advance, and an output signal from the high-accurate reference frequency generating means is used for a reference frequency.

BRIEF DESCRIPTION OF THE INVENTION

This and other objects, features, and advantages of the present invention will become more apparent upon a reading of the following detailed description and drawings, in which:

FIG. 5 is a view for explaining a control operation of a switch element;

FIG. 6 is a view for explaining a control operation of a switch element;

DESCRIPTION OF THE EMBODIMENTS

Figure 1:
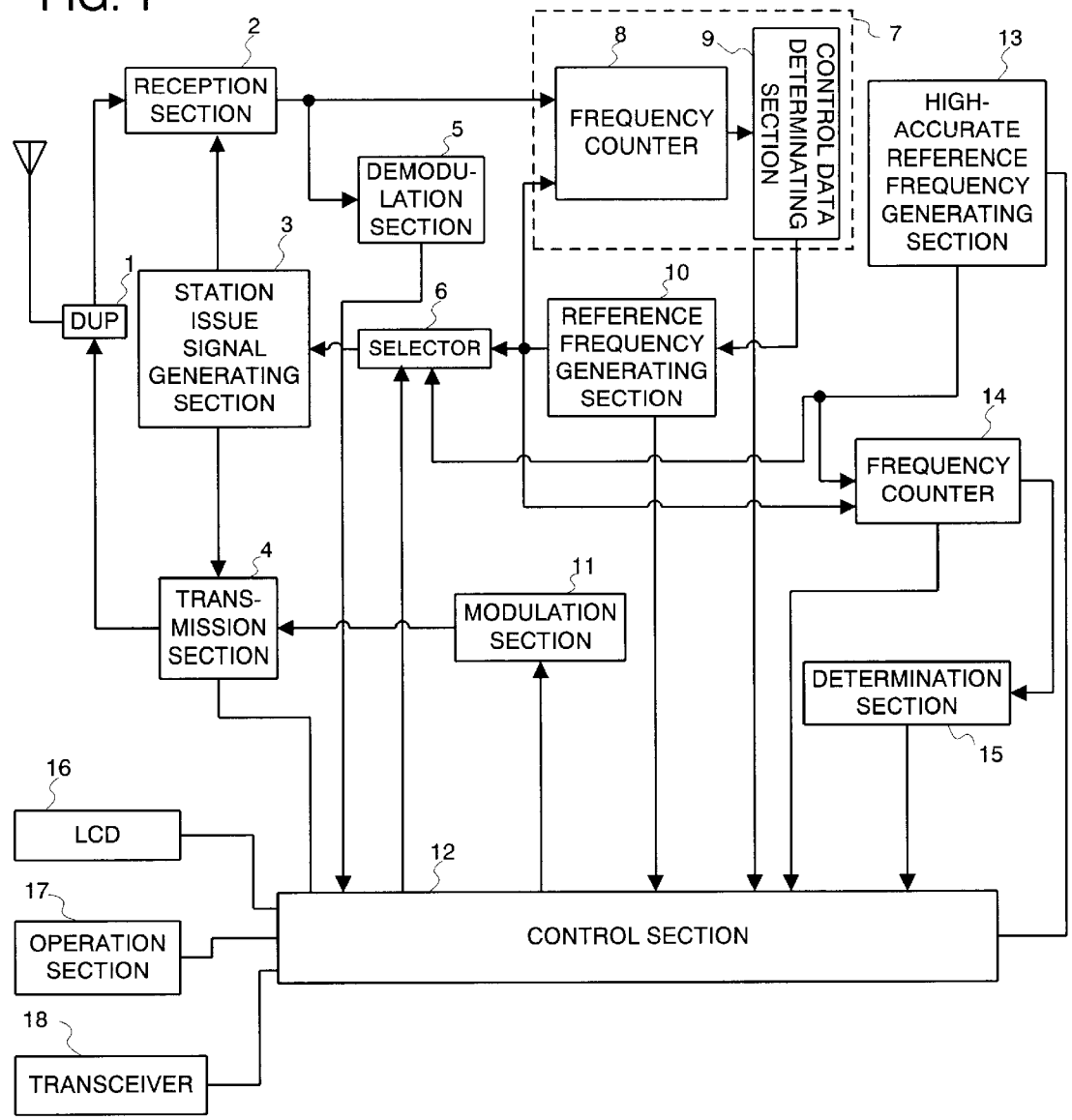
FIG. 1 is a block diagram showing the first embodiment.

Embodiments of the present invention will be explained in detail referring to the drawings.

First, the first embodiment will be explained.

FIG. 1 is a block diagram showing the first embodiment. In FIG. 1, a portable telephone apparatus of this embodiment is constructed of a common use section 1, a reception section 2, a local issue signal generating section 3, a transmission section 4, a demodulation section 5, a selector 6, an AFC section 7, a reference frequency generating section 10, a modulation section 11, a control section 12, a high-accurate reference frequency generating section 13, a frequency counter 14, a determination section 15, a display section 16, an operation section 17, and a transceiver 18. Also, the AFC section 7 has a frequency counter 8 and a control data determining section 9.

A signal of a carrier wave frequency on a radio channel, which was transmitted from a base station (not shown) and received by the common use section 1 via an antenna, is delivered to the reception section 2, and is mixed with a station issue signal, and is replaced by an intermediate frequency signal, and further, is supplied to the demodulation section 5 and the AFC section 7. The intermediate frequency signal supplied from the reception section 2 is demodulated as a voice signal in the demodulation section 5, and passes the control section 12, and voice information is output from the transceiver 18.

On the other hand, the voice information that was input to the transceiver 18 passes the control section 12, and is modulated in the modulation section 11, and is converted into a signal of a carrier wave on a radio channel in the transmission section 4, and after amplified, is supplied to the common use section 1 and is transmitted to a base station (not shown). Further, the display section 16 and the operation section 17 which provide convenience for conducting calling are connected to the control section 12.

The reference frequency generating section 10 is an electronic component capable of suitably changing frequency accuracy of an output signal in accordance with an input control voltage. Particularly, it is a VC-TCXO (voltage control type temperature compensation crystal oscillator) and so forth.

The frequency counter 8 of the AFC section 7 compares a reception signal down-converted into an intermediate frequency via the reception section 2 with a signal into which an output signal from the reference frequency generating section 10 is frequency-divided, and outputs an error thereof.

The control data determining section 9 determined a control voltage of the reference frequency generating section 10 based on a value measured by the frequency counter 8.

The high-accurate reference frequency generating section 13 has accuracy for a temperature change extremely higher than that of the reference frequency generating section 10, and is an electronic component in which output frequency accuracy thereof changes only within a range of prescribed values (frequency accuracy within a range where transmission and reception of a portable telephone can be conducted). Particularly, it is an OCXO (crystal oscillator with a thermostat) and so forth.

The frequency counter 14 compares an error of an output from the reference frequency generating section 10 by comparing an output from the reference frequency generating section 10 with an output from the high-accurate reference frequency generating section 13.

The determination section 15 determines whether or not frequency accuracy of the reference frequency generating section 10 is within the prescribed value range based on an output from the frequency counter 14.

In accordance with the control section 12, the selector 6 is a data selector for selecting any one of an output signal from the reference frequency generating section 10 and an output signal from the high-accurate reference frequency generating section 13, which are input thereto.

The station issue signal generating section 3 generates a station issue signal based on a reference frequency output from the selector 6, and outputs it to the reception section 2 and the transmission section 4.

Subsequently, an arrangement of switching between an output signal from the reference frequency generating section 10 and an output signal from the high-accurate reference frequency generating section 13 in this embodiment will be explained further in detail.

After completion of an AFC operation for making a reference frequency of the portable telephone apparatus coincide with a frequency deviation of a carrier wave frequency of the base station, the control section 12 conducts setting so that an output from the reference frequency generating section 10 and an output signal from the high-accurate reference frequency generating section 13 are compared with each other in the frequency counter 14. Since the high-accurate reference frequency generating section 13 has accuracy for a temperature change extremely higher than that of the reference frequency generating section 10, and output frequency accuracy thereof changes only within a range of prescribed values (frequency accuracy within a range where transmission and reception of a portable telephone can be conducted), an error of an output signal from the reference frequency generating section 10 is measured on the basis of an output from the high-accurate reference frequency generating section 13. And, whether or not the frequency error is within the prescribed values is determined by the determination section 15.

For instance, in case that the frequency accuracy of the output signal from the reference frequency generating section 10 meets the prescribed value based on a determination result of the determination section 15, the control section 12 controls an output from the selector 6 so as to be an output from the reference frequency generating section 10. In other words, the reference frequency is controlled so as to be an output signal from the reference frequency generating section 10. On the other hand, in case that the frequency accuracy of the output signal from the reference frequency generating section 10 does not meet the prescribed value based on the determination result of the determination section 15, the control section 12 controls an output from the selector 6 so as to be an output from the high-accurate reference frequency generating section 13. In other words, the reference frequency is controlled so as to be an output signal from the high-accurate reference frequency generating section 13.

Figure 2:
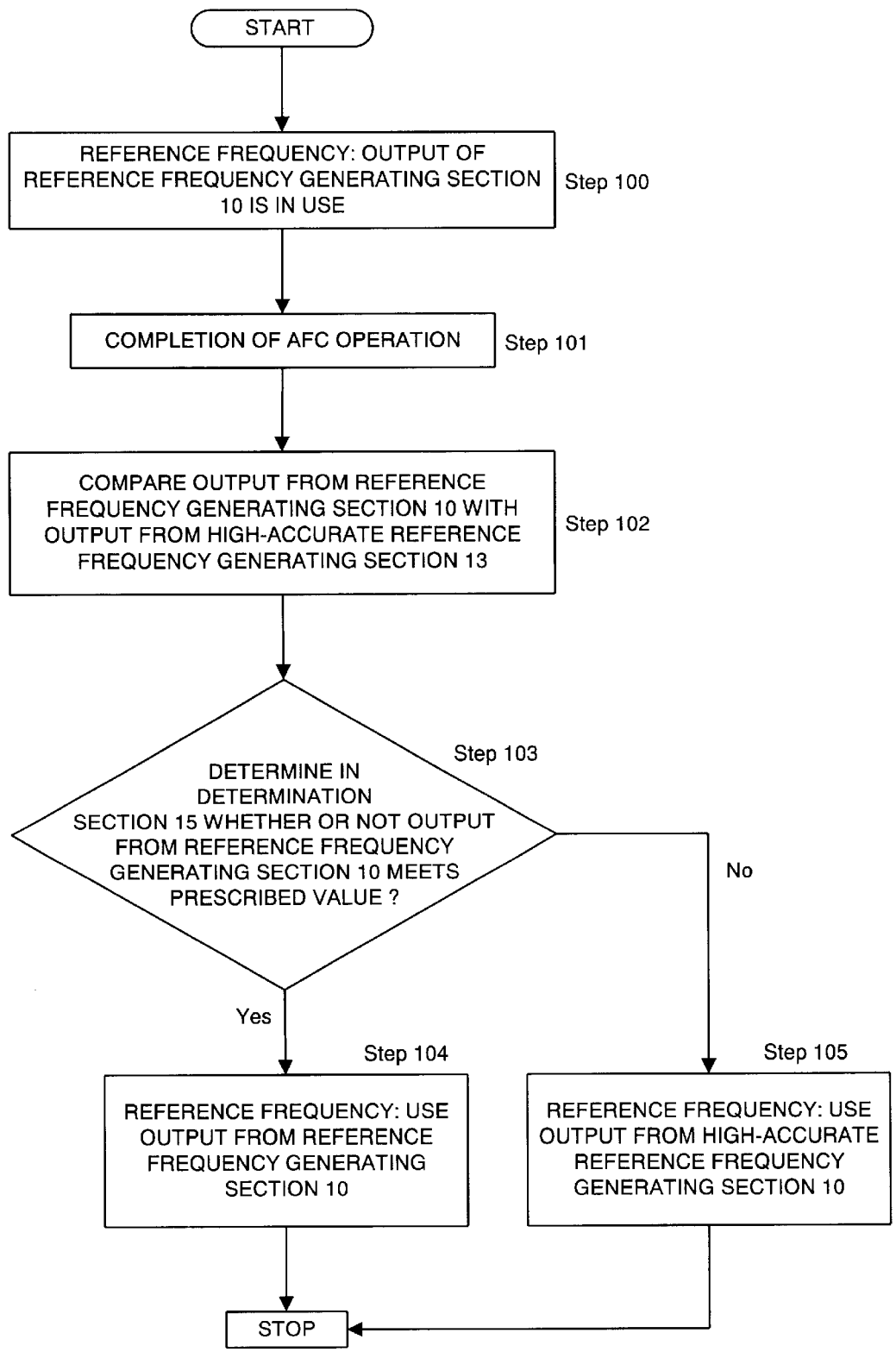
FIG. 2 is an operation flowchart in a case where an output signal from a reference frequency generating section 10 is used for a reference frequency.
Figure 3:
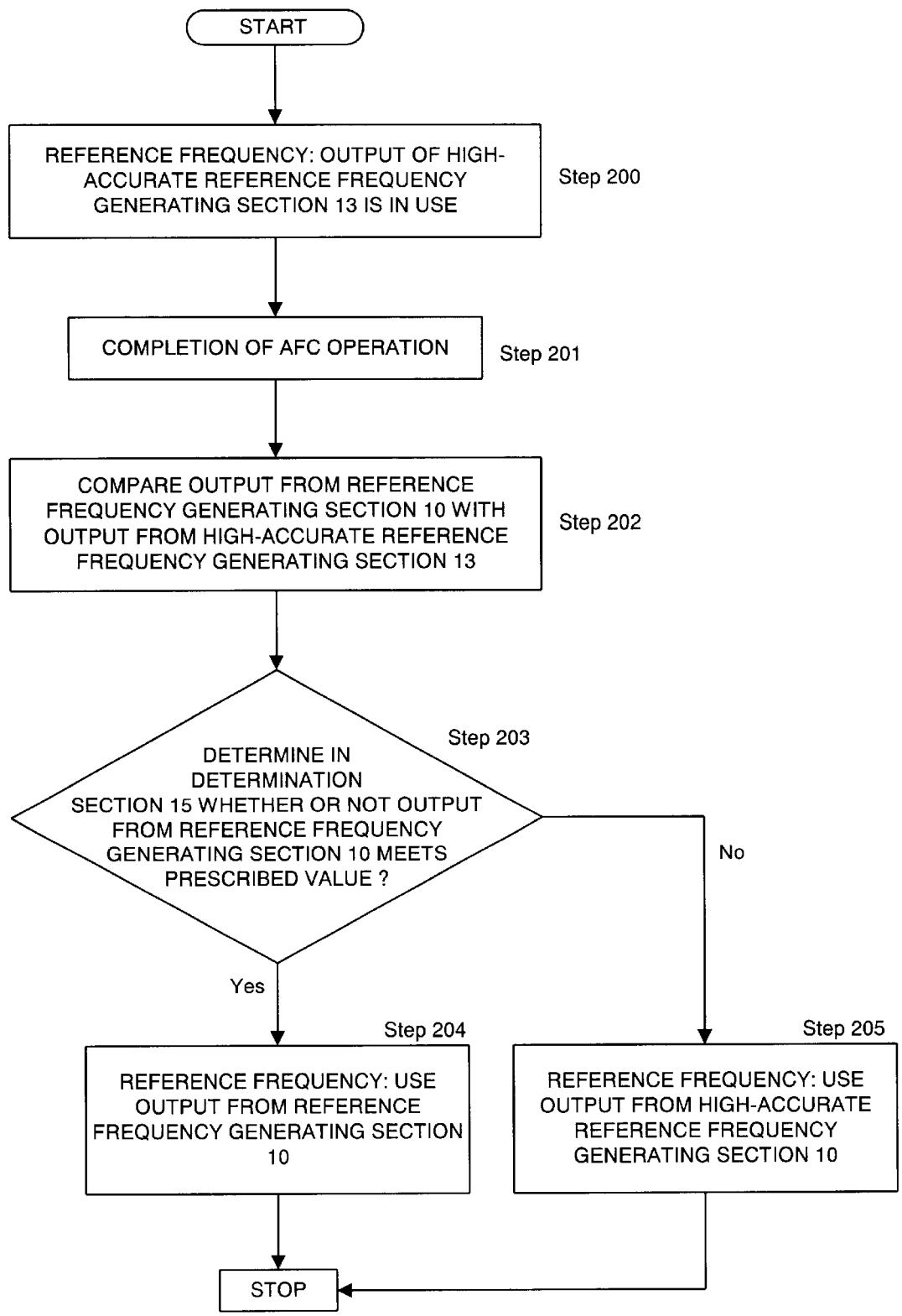
FIG. 3 is an operation flowchart in a case where an output signal from a high-accurate reference frequency generating section 13 is used for a reference frequency.

Next, a control operation in this embodiment will be explained using control flowcharts of FIG. 2 and FIG. 3.

First, FIG. 2 will be explained. FIG. 2 is a flowchart in a case where an output signal from the reference frequency generating section 10 is used for a reference frequency.

First, it is assumed that a signal from the reference frequency generating section 10 is output to an output of the selector 6 (STEP 100).

The control section 12 compares an intermediate frequency signal based on a signal received from a base station side with an output signal from the reference frequency generating section 10, and based on a deviation data thereof, an AFC operation is completed so that a frequency deviation of the reference frequency generating section 10 becomes to be a frequency deviation of a carrier wave frequency of a base station by means of a signal of an output from the control data determining section 9 (Since usually a reference frequency that is an origin of a signal transmitted from the base station is output from a reference frequency generator having extremely high stability, it is conducted so that frequency accuracy of an output signal from the reference frequency generating section 10 of the portable telephone apparatus is within the set prescribed value) (STEP 101).

Subsequently, the output signal from the reference frequency generating section 10 and the output signal from the high-accurate reference frequency generating section 13 are compared with each other (STEP 102). A result of the comparison is determined by the determination section 15 (STEP 103). As a result of the determination, in case that output signal frequency accuracy of the reference frequency generating section 10 meets the prescribed value, an output from the reference frequency generating section 10 is selected for a reference frequency, and that is, the selector 6 conducts control in accordance with the current setting (STEP 104). On the other hand, in case that output signal frequency accuracy of the reference frequency generating section 10 does not meet the prescribed value, an output from the high-accurate reference frequency generating section 13 is selected for a reference frequency, and that is, a signal from the high-accurate reference frequency generating section 13 is controlled to be output to an output of the selector 6 (STEP 105).

Next, FIG. 3 will be explained. FIG. 3 is a flowchart in a case where an output signal from the high-accurate reference frequency generating section 13 is used for a reference frequency.

First, a signal from the high-accurate reference frequency generating section 13 is output to an output of the selector 6 (STEP 200).

The control section 12 commences an AFC operation by means of an output signal from the reference frequency generating section 10, and after completion of the AFC operation (STEP 201), the output signal from the reference frequency generating section 10 and the output signal from the high-accurate reference frequency generating section 13 are compared with each other by means of the frequency counter 14.

Based on a result of the comparison, the determination section determines whether or not frequency accuracy of the reference frequency generating section 10 meets the prescribed value (STEP 203). As a result of the determination, in case that frequency accuracy of an output signal from the reference frequency generating section 10 meets the prescribed value, the output signal from the reference frequency generating section 10 is used for a reference frequency, and that is, the output signal from the reference frequency generating section 10 is controlled to be output to an output of the selector 6 (STEP 204). On the other hand, in case that frequency accuracy of the output signal from the reference frequency generating section 10 does not meet the prescribed value, an output signal from the high-accurate reference frequency generating section 13 is used for a reference frequency, and that is, control is conducted so that the setting of the selector 6 is kept the current setting (STEP 205).

By conducting such control, since the reference frequency inside the portable telephone apparatus always keeps prescribed frequency accuracy, the portable telephone apparatus can always keep good communication condition, and also, even though heat influence exists due to long-time calling and so forth, a transmission and reception characteristic can be kept good.

In addition, although, in this embodiment, for detecting the frequency accuracy of the output signal from the reference frequency generating section 10, an error of the output signal from the reference frequency generating section 10 is measured on the basis of the output signal from the high-accurate reference frequency generating section 13, an arrangement can be adopted, in which a count value within a range which meets a prescribed value is previously set, and the count value and a count value of the output signal from the reference frequency generating section 10 are compared with each other.

The second embodiment will be explained.

Figure 4:
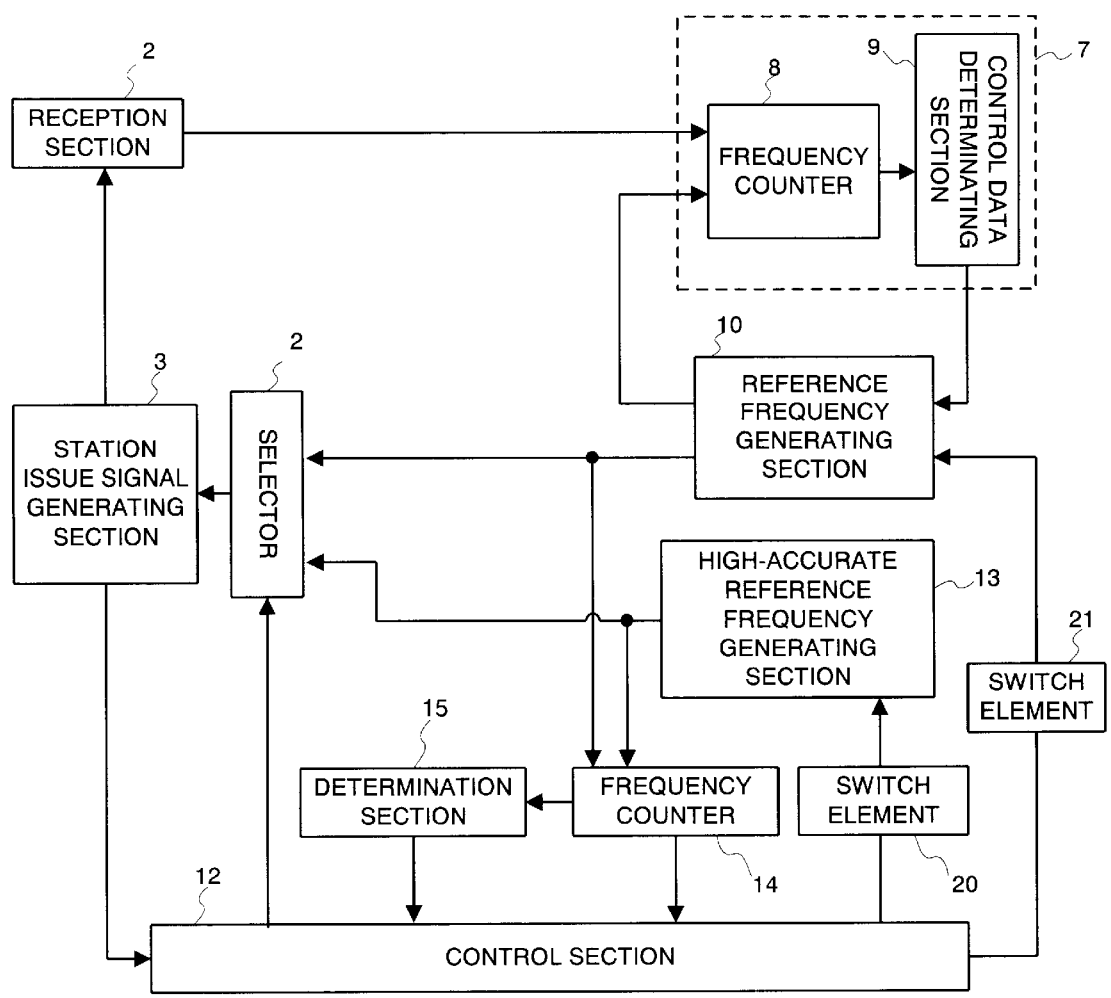
FIG. 4 is a block diagram of main sections in the second embodiment.

FIG. 4 is a block diagram of main sections in the second embodiment. In addition, as for components same as those in the first embodiment, the same reference numerals are attached thereto, and explanation thereof will be omitted.

In the second embodiment, in addition to the above-mentioned first embodiment, it is characterized in that electronic switches for turning on and off power supplies of the reference frequency generating section 10 and the high-accurate reference frequency generating section 13 are provided. These electronic switches are consisted of switch elements 20 and 21, and are transistor switches for turning on and off the reference frequency generating section 10 and the high-accurate reference frequency generating section 13, respectively, in accordance with the control section 12.

As shown in FIG. 5 and FIG. 6, these switch elements are controlled so that the power supply is turned off for saving a consumption electric current in case that the high-accurate reference frequency generating section 13 compares an output signal thereof with an output signal from the reference frequency generating section 10 (whether frequency accuracy of the reference frequency generating section 10 meets a prescribed value is determined) and other than a case where the output signal is used for a reference frequency. Also, the reference frequency generating section 10 is controlled so that the power supply is turned off when an output signal from the high-accurate reference frequency generating section 13 is used for a reference frequency and other than a time period during which an AFC operation is conducted. BY means of these operations, a consumption electric current is saved.

Figure 7:
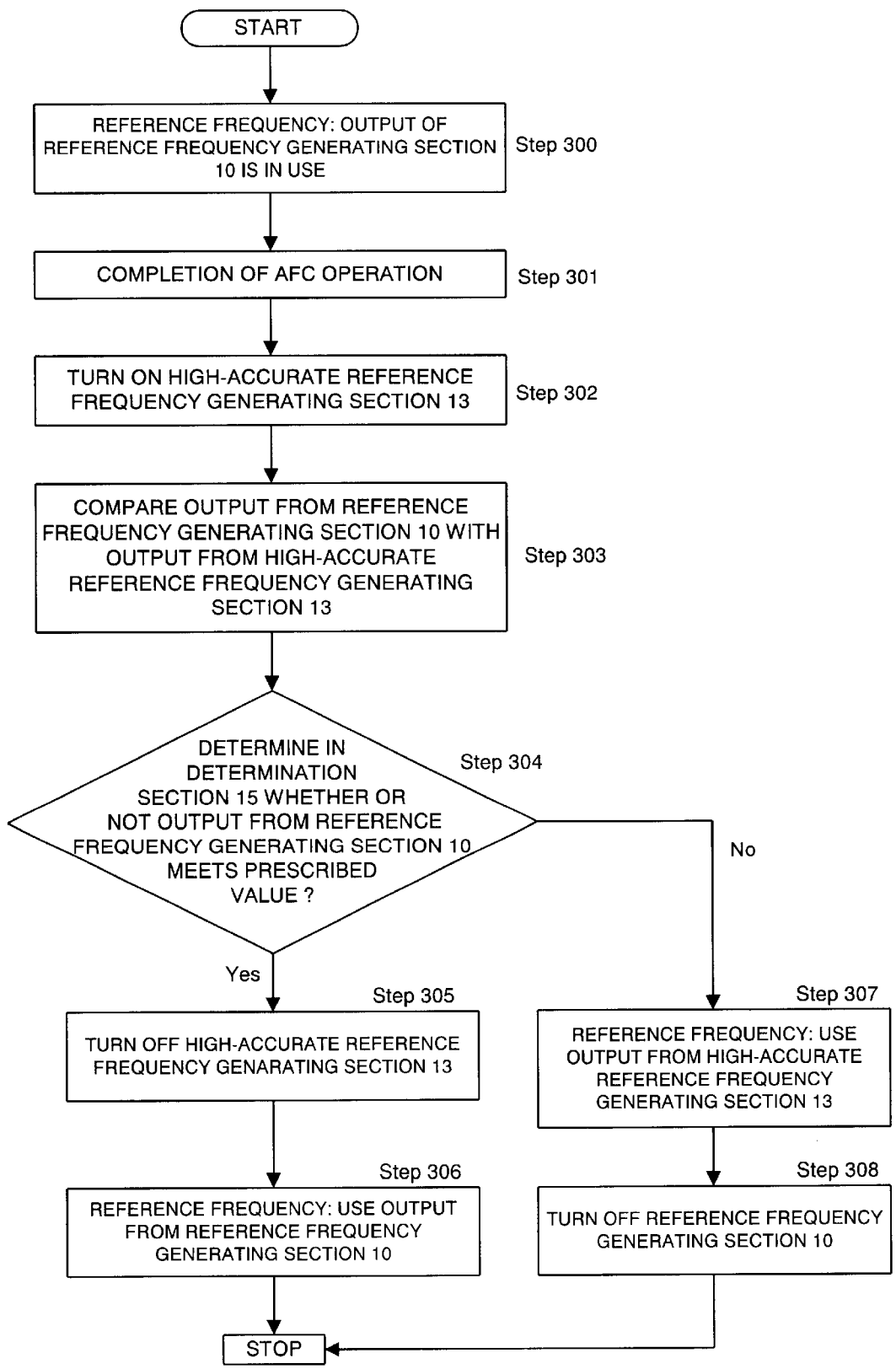
FIG. 7 is an operation flowchart in a case where an output signal from a reference frequency generating section 10 is used for a reference frequency.
Figure 8:
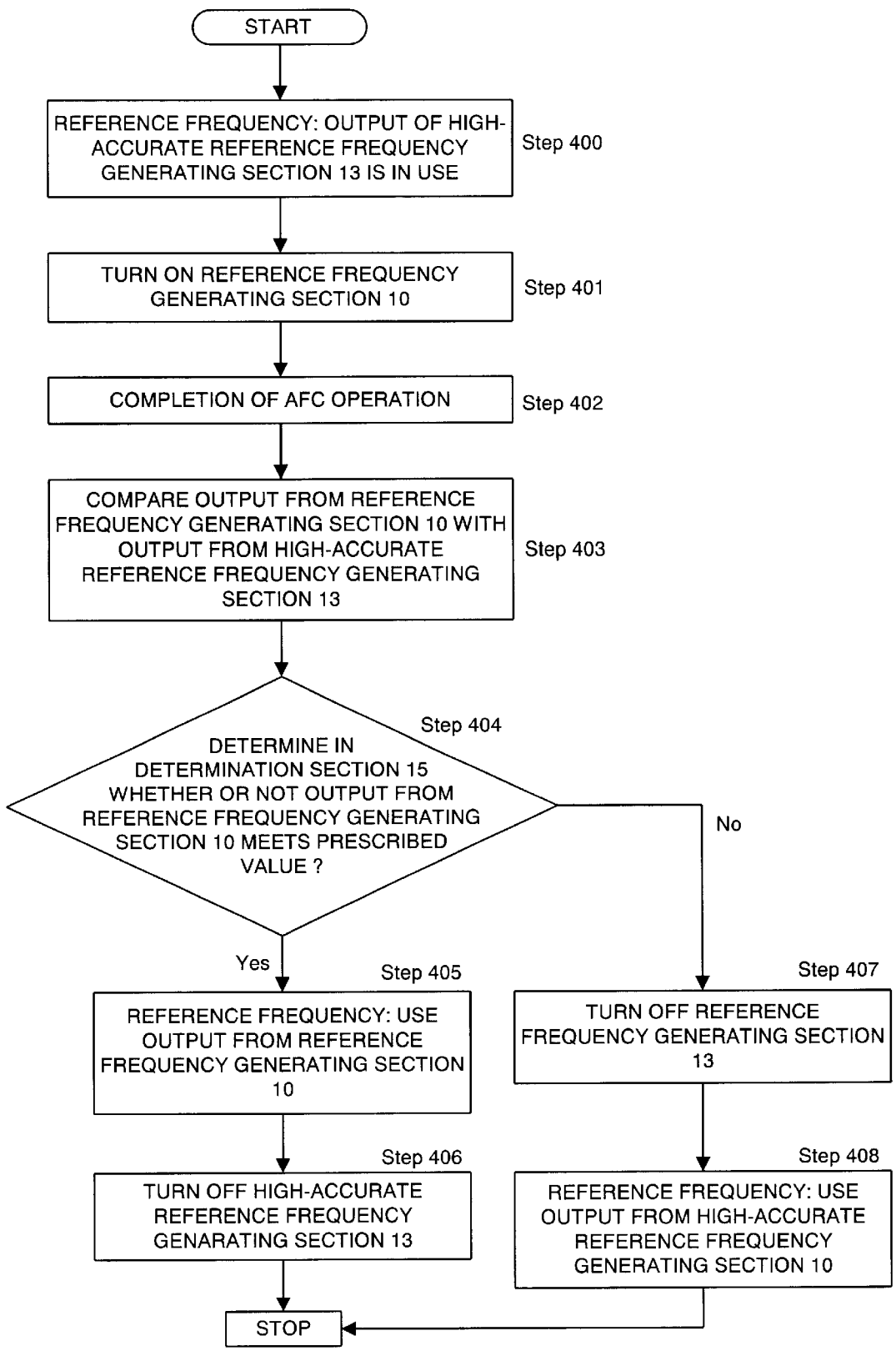
FIG. 8 is an operation flowchart in a case where an output signal from a high-accurate reference frequency generating section 13 is used for a reference frequency.

The above-mentioned operation will be explained using control flowcharts of FIG. 7 and FIG. 8.

First, FIG. 7 will be explained. FIG. 7 is a flowchart in a case where an output signal from the reference frequency generating section 10 is used for a reference frequency.

First, it is assumed that a signal from the reference frequency generating section 10 is output to an output of the selector 6 (STEP 300).

The control section 12 compares an intermediate frequency signal based on a signal received from a base station side with an output signal from the reference frequency generating section 10, and based on a deviation data thereof, an AFC operation is completed so that a frequency deviation of the reference frequency generating section 10 becomes to be a frequency deviation of a carrier wave frequency of a base station by means of a signal of an output from the control data determining section 9 (Since usually a reference frequency that is an origin of a signal transmitted from the base station is output from a reference frequency generator having extremely high stability, it is conducted so that frequency accuracy of an output signal from the reference frequency generating section 10 of the portable telephone apparatus is within the set prescribed value) (STEP 301).

Subsequently, the power supply of the high-accurate reference frequency generating section 13 is turned on (STEP 302), and the output signal from the reference frequency generating section 10 and the output signal from the high-accurate reference frequency generating section 13 are compared with each other (STEP 303). And, a result of the comparison is determined by the determination section 15 (STEP 304).

As a result of the determination, in case that output signal frequency accuracy of the reference frequency generating section 10 meets the prescribed value, the power supply of the high-accurate reference frequency generating section 13 is turned off (STEP 305), and an output from the reference frequency generating section 10 is selected for a reference frequency, and that is, the selector 6 conducts control in accordance with the current setting (STEP 306). On the other hand, in case that output signal frequency accuracy of the reference frequency generating section 10 does not meet the prescribed value, it is set that an output from the high-accurate reference frequency generating section 13 is selected for a reference frequency, and that is, a signal from the high-accurate reference frequency generating section 13 is controlled to be output to an output of the selector 6 (STEP 307). And, the power supply of the reference frequency generating section 10 is turned off (STEP 308).

Next, FIG. 8 will be explained. FIG. 8 is a flowchart in a case where an output signal from the high-accurate reference frequency generating section 13 is used for a reference frequency.

First, a signal from the high-accurate reference frequency generating section 13 is output to an output of the selector 6 (STEP 400).

The control section 12 turns on the reference frequency generating section 10 (STEP 401), and commences an AFC operation by means of an output signal from the reference frequency generating section 10, and completes the AFC operation (STEP 402). And, the output signal from the reference frequency generating section 10 and the output signal from the high-accurate reference frequency generating section 13 are compared with each other (STEP 403). Based on a result of the comparison, the determination section 15 determines whether or not frequency accuracy of the reference frequency generating section 10 meets the prescribed value (STEP 404).

As a result of the determination, in case that frequency accuracy of an output signal from the reference frequency generating section 10 meets the prescribed value, the output signal from the reference frequency generating section 10 is used for a reference frequency, and that is, the output signal from the reference frequency generating section 10 is controlled to be output to an output of the selector 6 (STEP 405). And, the power supply of the high-accurate reference frequency generating section 13 is turned off (STEP 406). On the other hand, in case that frequency accuracy of the output signal from the reference frequency generating section 10 does not meet the prescribed value, an output signal from the high-accurate reference frequency generating section 13 is used for a reference frequency, and that is, control is conducted so that the setting of the selector 6 is kept the current setting (STEP 407). And, the power supply of the reference frequency generating section 10 is turned off (STEP 408).

By adopting such an arrangement, saving of consumption power can be promoted.

The third embodiment will be explained.

Figure 9:
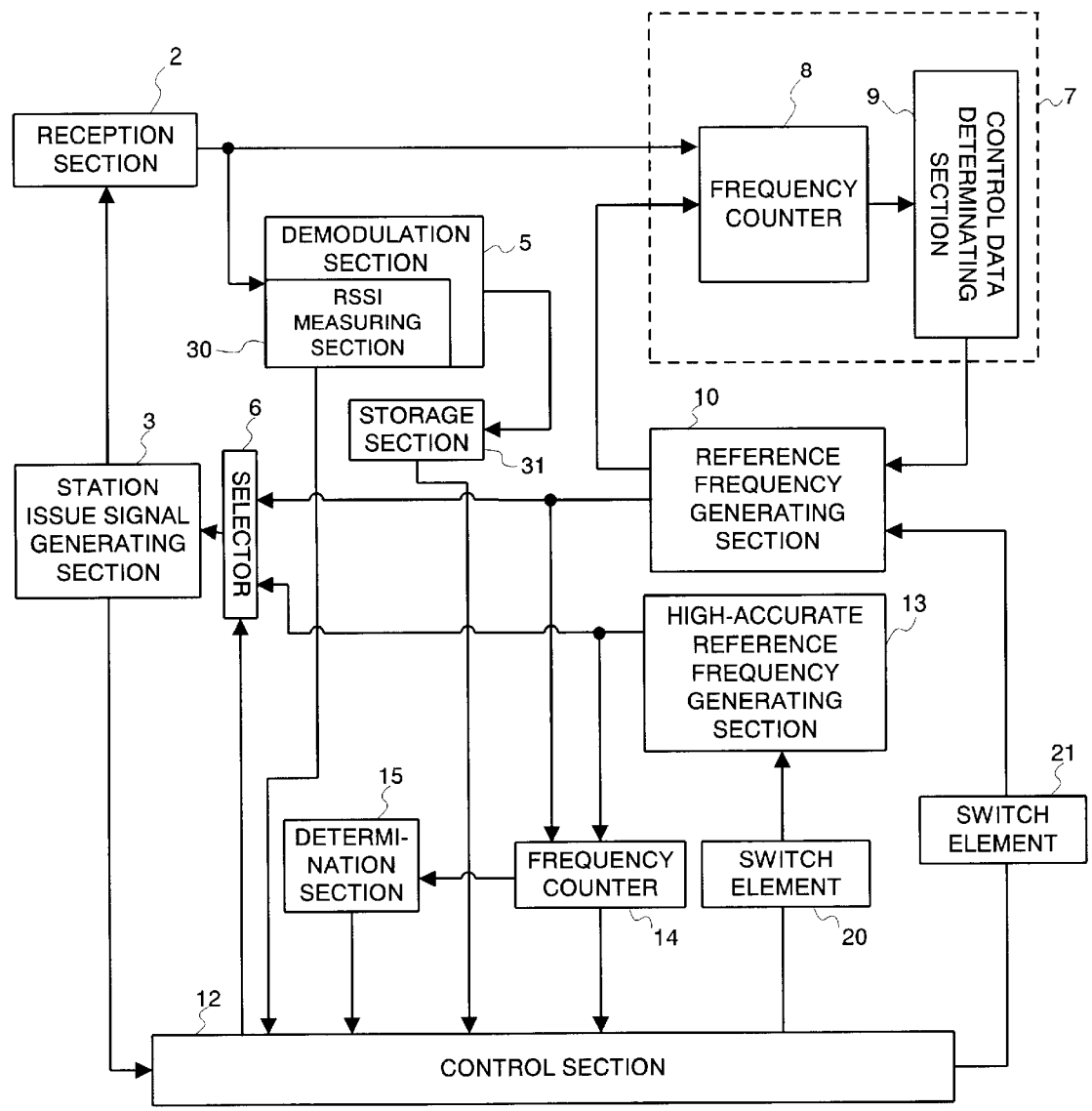
FIG. 9 is a block diagram of main sections in the third embodiment.

FIG. 9 is a block diagram of main sections in the third embodiment. In addition, as for components same as those in the first embodiment and the second embodiment, the same reference numerals are attached thereto, and explanation thereof will be omitted.

In the third embodiment, in addition to the above-mentioned first embodiment and second embodiment, it is characterized in that an RSSI measuring section 30 is provided in the demodulation section 5, and after an AFC operation, an operation in which an output signal from the reference frequency generating section 10 and an output signal from the high-accurate reference frequency generating section 13 are compared with each other is not certainly conducted, and based on a change of an RSSI value, the operation in which the output signal from the reference frequency generating section 10 and the output signal from the high-accurate reference frequency generating section 13 are compared with each other is conducted, and power consumption can be further reduced.

The RSSI measuring section 30 is a block for measuring an RSSI (Received Signal Strength Indicator) based on a reception signal.

A storage section 31 stores an RSSI value read from the RSSI measuring section 30, and is a circuit in which an RSSI threshold value is stored for determining whether the output signal from the reference frequency generating section 10 and the output signal from the high-accurate reference frequency generating section 13 are compared with each other.

Generally, if a frequency of the reference frequency in the portable telephone apparatus is shifted, that is to say, if the frequency becomes not to coincide with a carrier wave frequency of a base station to which the apparatus is connected, the RSSI value of the portable telephone apparatus becomes smaller and should be deteriorated if reception power that is received through an antenna does not become larger.

Accordingly, the RSSI value after the AFC operation is stored in the storage section 31, and when the measured RSSI value is smaller than the RSSI threshold value stored in the storage section 31, and the output signal from the reference frequency generating section 10 is being used for a reference frequency, the output signal from the reference frequency generating section 10 and the output signal from the high-accurate reference frequency generating section 13 are compared with each other, and when frequency accuracy of the reference frequency does not meet a prescribed value, the output from the high-accurate reference frequency generating section 13 is controlled to be a reference frequency.

On the other hand, after the AFC operation, when the measured RSSI value is larger than the RSSI threshold value stored in the storage section 31, and the output signal from the high-accurate reference frequency generating section 13 is being used for a reference frequency, the output signal from the reference frequency generating section 10 and the output signal from the high-accurate reference frequency generating section 13 are compared with each other, and when frequency accuracy of the reference frequency meets a prescribed value, the output from the reference frequency generating section 10 is controlled to be a reference frequency.

Figure 10:
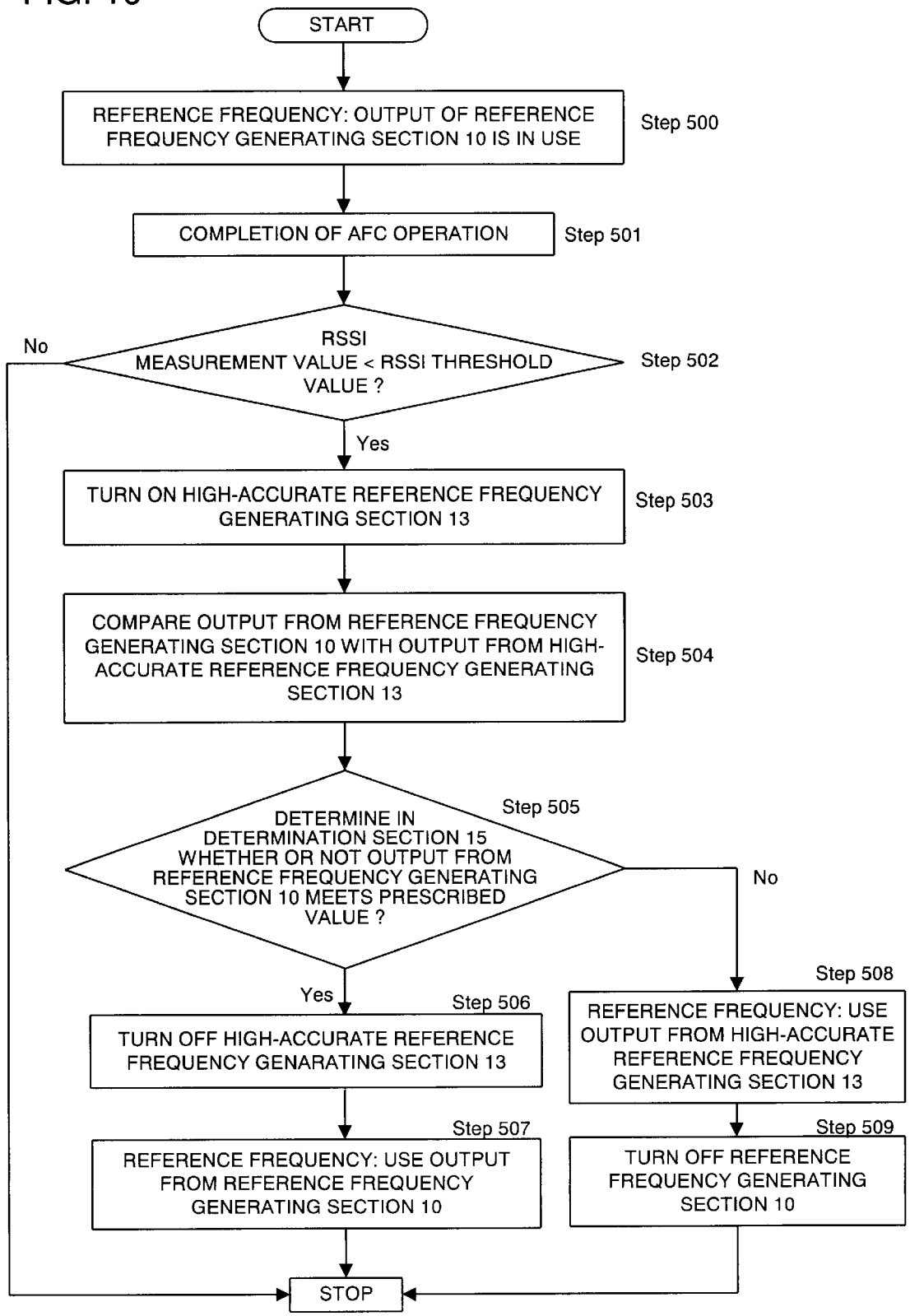
FIG. 10 is an operation flowchart in a case where an output signal from a reference frequency generating section 10 is used for a reference frequency.
Figure 11:
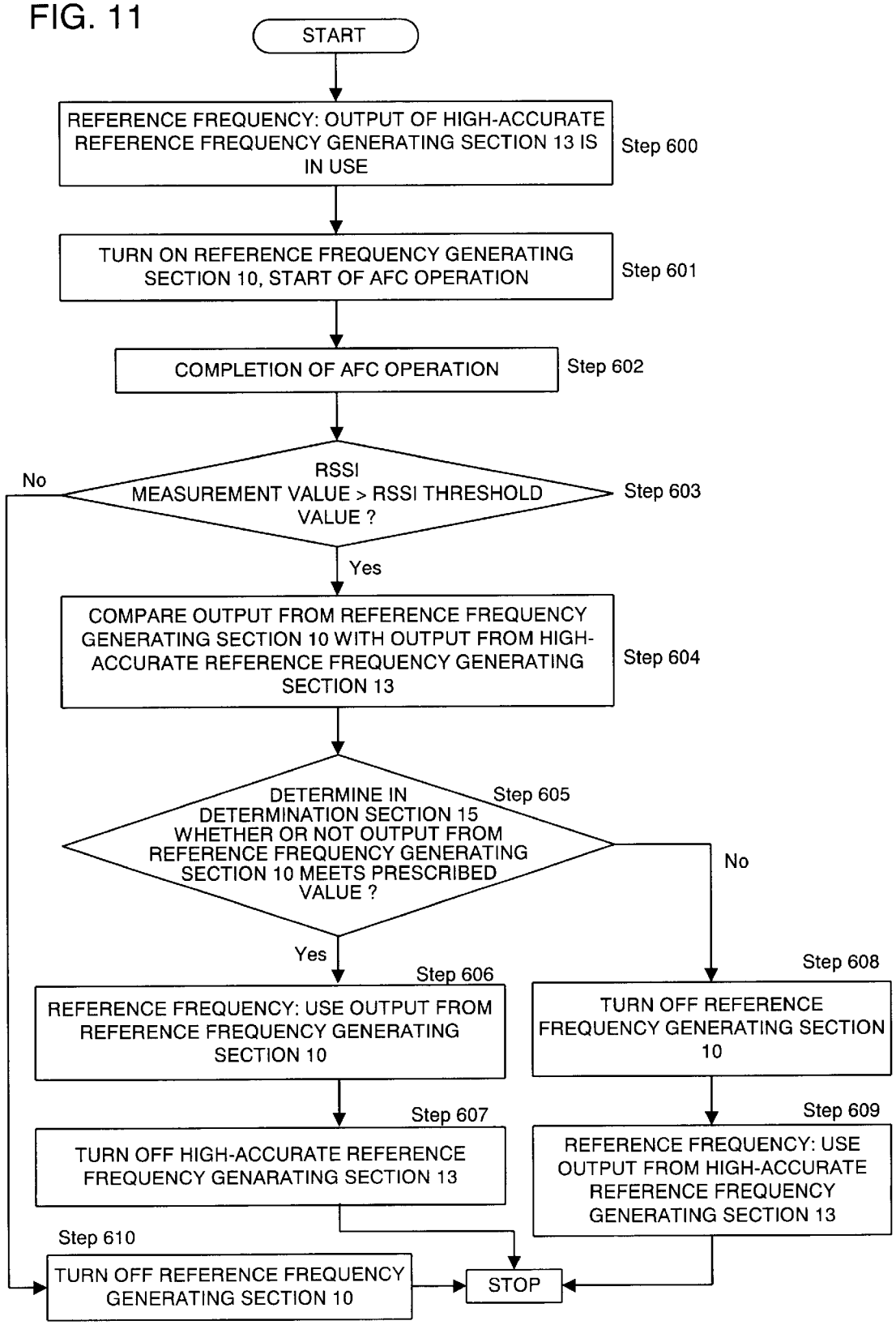
FIG. 11 is an operation flowchart in a case where an output signal from a high-accurate reference frequency generating section 13 is used for a reference frequency and FIG. 12 is a view for explaining a prior art.
Figure 12:
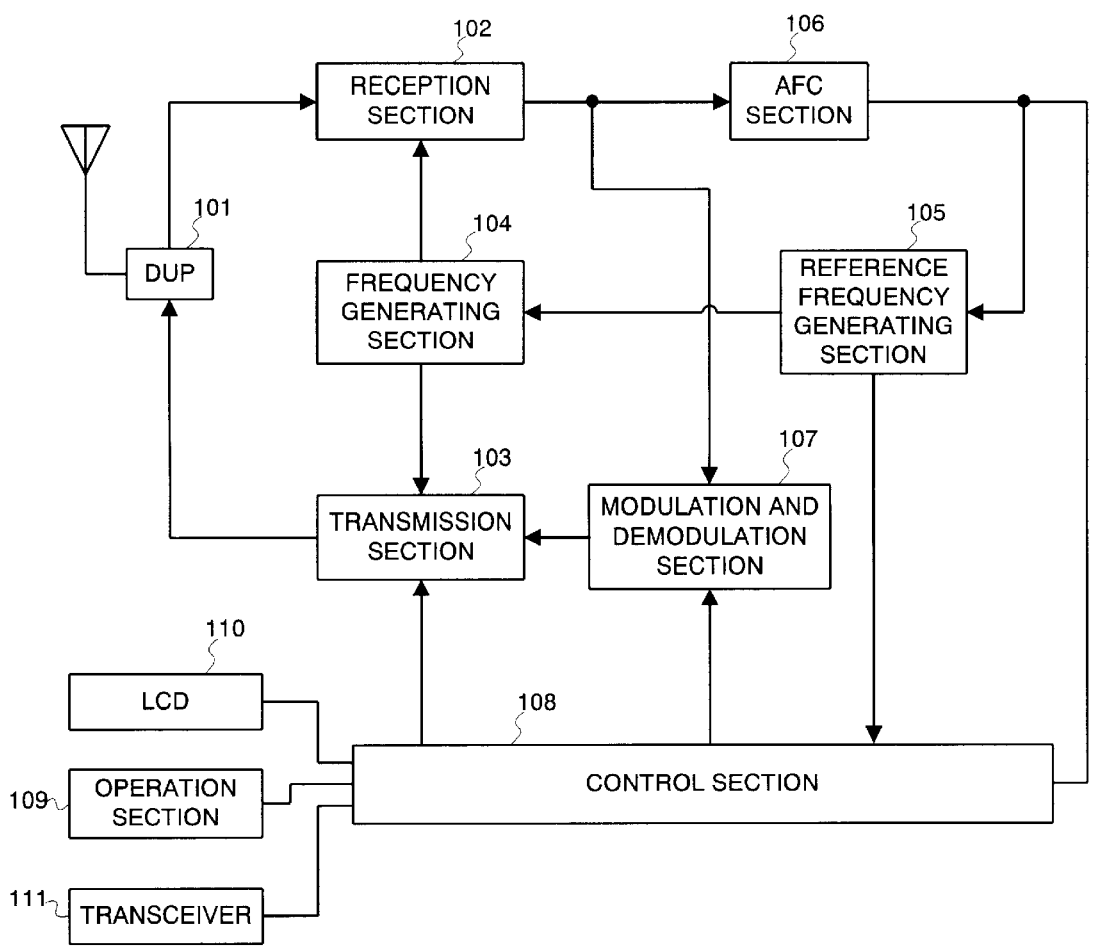

Next, these operations will be explained using control flowcharts of FIG. 10 and FIG. 11.

First, FIG. 10 will be explained. FIG. 10 is a flowchart in a case where an output signal from the reference frequency generating section 10 is used for a reference frequency.

First, a signal from the reference frequency generating section 10 is output to an output of the selector 6 (STEP 500).

After completion of the AFC operation (STEP 501), the control section 12 compares an RSSI value calculated by the RSSI measuring section 20 with an RSSI threshold value set in the storage section 21 (STEP 502).

As a result of the comparison, if the calculated RSSI value is higher than the RSSI threshold value, the current setting is maintained and the process ends. On the other hand, if the RSSI value is lower than the RSSI threshold value, the power supply of the high-accurate reference frequency generating section 13 is turned on (STEP 503).

Subsequently, the output signal from the reference frequency generating section 10 and the output signal from the high-accurate reference frequency generating section 13 are compared with each other (STEP 504). And, a result of the comparison is determined by the determination section 15 (STEP 505).

As a result of the determination, in case that output signal frequency accuracy of the reference frequency generating section 10 meets a prescribed value, the power supply of the high-accurate reference frequency generating section 13 is turned off (STEP 506), and an output from the reference frequency generating section 10 is selected for a reference frequency, and that is, the selector 6 conducts control in accordance with the current setting (STEP 507). On the other hand, in case that output signal frequency accuracy of the reference frequency generating section 10 does not meet the prescribed value, it is set that an output from the high-accurate reference frequency generating section 13 is selected for a reference frequency, and that is, a signal from the high-accurate reference frequency generating section 13 is controlled to be output to an output of the selector 6 (STEP 508). And, the power supply of the reference frequency generating section 10 is turned off (STEP 509).

Next, FIG. 11 will be explained. FIG. 11 is a flowchart in a case where an output signal from the high-accurate reference frequency generating section 13 is used for a reference frequency.

First, a signal from the high-accurate reference frequency generating section 13 is output to an output of the selector 6 (STEP 600).

The control section 12 turns on the power supply of the reference frequency generating section 10, and commences an AFC operation by means of an output signal from the reference frequency generating section 10 (STEP 601), and completes the AFC operation (STEP 602).

Subsequently, an RSSI value calculated by the RSSI measuring section 20 and an RSSI threshold value set in the storage section 21 are compared with each other (STEP 603), and if the RSSI value is lower than the RSSI threshold value, the current setting is maintained, and the power supply of the reference frequency generating section 10 is turned off (STEP 610).

On the other hand, if the RSSI value is higher than the RSSI threshold value, an output signal from the reference frequency generating section 10 and an output signal from the high-accurate reference frequency generating section 13 are compared with each other (STEP 604). And, a result of the comparison is determined by the determination section 15 on whether frequency accuracy of the reference frequency generating section 10 meets a prescribed value (STEP 605).

As a result of the determination, in case that frequency accuracy of an output signal from the reference frequency generating section 10 meets the prescribed value, the output signal from the reference frequency generating section 10 is used for a reference frequency. In other words, the output signal from the reference frequency generating section 10 is controlled to be output to an output of the selector 6 (STEP 606). And, the power supply of the high-accurate reference frequency generating section 13 is turned off (STEP 607). On the other hand, in case that frequency accuracy of the output signal from the reference frequency generating section 10 does not meet the prescribed value, the power supply of the reference frequency generating section 10 is turned off (STEP 608). And, an output signal from the high-accurate reference frequency generating section 13 is used for a reference frequency. In other words, control is conducted so that the setting of the selector 6 is kept the current setting (STEP 609).

By making the apparatus operate in this manner, further reduction of power consumption can be promoted.

In addition, although, in this embodiment, for a comparison value of a start condition for an operation in which the output signal from the reference frequency generating section 10 and the output signal from the high-accurate reference frequency generating section 13 are compared with each other, the RSSI value is used, it is possible to conduct control same as the above-described one by using a reception quality value measured from a measurement block of a reception quality value (a bit error rate and so forth) of a reception signal. In this case, reception data error rate information and so forth estimated by the demodulation section 5 may be supplied to the control section 12, and be determined.

According to the present invention, an advantage that reception condition can be always kept good is effected. The reason thereof is that, by investigating frequency accuracy of an output signal from the reference frequency generating section 10 using an output signal from the high-accurate reference frequency generating section 13, control is conducted so that a high-accurate reference frequency is used for a reference frequency in case that frequency accuracy of a reference frequency when an AFC operation failed is not within a prescribed value, and thereby, the frequency accuracy of the reference frequency is always maintained stably, and reception condition can be kept good.

Also, according to the present invention, an advantage that deterioration of reception condition due to heat is prevented, and long-time calling becomes possible is effected. The reason thereof is that, even though the frequency accuracy of the output signal from the reference frequency generating section 10 is not controlled due to heat, control is conducted so that a high-accurate reference frequency is used for a reference frequency, and thereby, the frequency accuracy of the reference frequency is always maintained stably.

What is claimed is:

1. A portable telephone apparatus characterized in that said apparatus comprises:
   reference frequency generating means capable of changing an output frequency for communication with a base station by means of a voltage control signal;
   high-accurate reference frequency generating means in which frequency accuracy always meets a prescribed value;
   determination means for determining whether or not frequency accuracy of an output signal from said reference frequency generating means meets a-predetermined said prescribed value; and
   selection means for selecting an output signal from said reference frequency generating means in case that a determination result of said determination means meets said prescribed value, and for selecting an output signal from said high-accurate reference frequency generating means in case that a determination result of said determination means does not meet said prescribed value.

2. A portable telephone apparatus recited in claim 1, wherein an output signal from said reference frequency generating means, which is used for said determination, is an output signal after an AFC operation of said reference frequency generating means.

3. A portable telephone apparatus recited in claim 1, wherein a power supply of said high-accurate reference frequency generating means is turned off other than a time period during which an output signal from said high-accurate reference frequency generating means is used for a reference frequency, and
   said apparatus further comprises power supply controlling means for turning off a power supply of said reference frequency generating means other than a time period during which an output signal that is used for determination is generated in case that an output signal from said high-accurate reference frequency generating means is used for a reference frequency.

4. A portable telephone apparatus recited in claim 3, wherein an output signal from said reference frequency generating means, which is used for said determination, is an output signal after an AFC operation of said reference frequency generating means.

5. A portable telephone apparatus recited in claim 1, wherein in said apparatus further comprises:
   RSSI measuring means for measuring RSSI based on a reception signal; and
   RSSI comparison means for storing a predetermined RSSI threshold value in advance, and comparing said RSSI threshold value with an RSSI measurement value measured by said RSSI measuring means, and
   said determination means is constructed so as to conduct determination in case that, with regard to a comparison result of said RSSI comparison means, said RSSI measurement value is smaller than said RSSI threshold value, and an output signal from said reference frequency generating means is used for a reference frequency, and in case that said RSSI measurement value is larger than said RSSI threshold value, and an output signal from the high-accurate reference frequency generating means is used for a reference frequency.

6. A portable telephone apparatus recited in claim 1, wherein said apparatus further comprises:
   measurement means for measuring reception quality of a reception signal; and
   reception quality comparison means for storing predetermined reception quality in advance, and comparing said reception quality with reception quality measured by said measurement means, and
   said determination means is constructed so as to conduct determination in case that, with regard to a comparison result of said reception quality comparison means, reception quality measured by said measurement means is worse than said reception quality stored in advance, and an output signal from said reference frequency generating means is used for a reference frequency, and in case that reception quality measured by said measurement means is better than said reception quality stored in advance, and an output signal from the high-accurate reference frequency generating means is used for a reference frequency.

7. A portable telephone apparatus comprises:
   reference frequency generating means capable of changing an output frequency for communication with a base station by means of a voltage control signal;
   high-accurate reference frequency generating means in which frequency accuracy always meets a prescribed value;

comparison means for comparing an output signal after an AFC operation of said reference frequency generating means with an output signal from said high-accurate reference frequency generating means;

determination means for determining whether or not frequency accuracy of an output signal after an AFC operation of said reference frequency generating means meets a said prescribed value, based on a comparison result of said comparison means;

selection means for selecting an output signal from said reference frequency generating means in case that a determination result of said determination means meets said prescribed value, and for selecting an output signal from said high-accurate reference frequency generating means in case that a determination result of said determination means does not meet said prescribed value; and power supply controlling means for turning off a power supply of said high-accurate reference frequency generating means in case that an output signal from said high-accurate reference frequency generating means is used for a reference frequency and other than a case in which an output signal from said high-accurate reference frequency generating means is used in said comparison, and for turning off a power supply of said reference frequency generating means in case that an output signal from said high-accurate reference frequency generating means is used for a reference frequency and other than a time period during which an AFC operation is conducted.

8. A portable telephone apparatus recited in claim 7, wherein said apparatus further comprises:

RSSI measuring means for measuring RSSI based on a reception signal; and

RSSI comparison means for storing a predetermined RSSI threshold value in advance, and comparing said RSSI threshold value with an RSSI measurement value measured by said RSSI measuring means, and said determination means is constructed so as to conduct determination in case that, with regard to a comparison result of said RSSI comparison means, said RSSI measurement value is smaller than said RSSI threshold value, and an output signal from said reference frequency generating means is used for a reference frequency, and in case that said RSSI measurement value is larger than said RSSI threshold value, and an output signal from the high-accurate reference frequency generating means is used for a reference frequency.

9. A portable telephone apparatus recited in claim 7, wherein said apparatus further comprises:

measurement means for measuring reception quality of a reception signal; and reception quality comparison means for storing predetermined reception quality in advance, and comparing said reception quality with reception quality measured by said measurement means, and said determination means is constructed so as to conduct determination in case that, with regard to a comparison result of said reception quality comparison means, reception quality measured by said measurement means is worse than said reception quality stored in advance, and an output signal from said reference frequency generating means is used for a reference frequency, and in case that reception quality measured by said measurement means is better than said reception quality stored in advance, and an output signal from the high-accurate reference frequency generating means is used for a reference frequency.

10. A stably supplying method of a reference frequency in a portable telephone apparatus comprises steps-of:

providing reference frequency generating means capable of changing an output frequency for communication with a base station by means of a voltage control signal, and high-accurate reference frequency generating means in which frequency accuracy always meets a prescribed value;

determining whether or not frequency accuracy of an output signal from said reference frequency generating means meets said prescribed value; and selecting an output signal from said reference frequency generating means in case that a result of said determination meets said prescribed value, and for selecting an output signal from said high-accurate reference frequency generating means in case that a determination result of said determination means does not meet said prescribed value.

11. A stably supplying method of a reference frequency recited in claim 10, wherein an output signal from said reference frequency generating means, which is used for said determination, is an output signal after an AFC operation of said reference frequency generating means.

12. A stably supplying method of a reference frequency recited in claim 10, wherein said method comprises:

turning off a power supply of said high-accurate reference frequency generating means other than a time period during which an output signal from said high-accurate reference frequency generating means is used for a reference frequency; and turning off a power supply of said reference frequency generating means other than a time period during which an output signal that is used for determination is generated in case that an output signal from said high-accurate reference frequency generating means is used for a reference frequency.

13. A stably supplying method of a reference frequency recited in claim 10, wherein said method further comprises:

measuring RSSI based on a reception signal; and comparing a predetermined RSSI threshold value stored in advance with said measured RSSI measurement value, and said step of determining whether or not said predetermined prescribed value is met and steps subsequent to this step are conducted only in case that, with regard to a comparison result of said RSSI, said RSSI measurement value is smaller than said RSSI threshold value, and an output signal from said reference frequency generating means is used for a reference frequency, and in case that said RSSI measurement value is larger than said RSSI threshold value, and an output signal from the high-accurate reference frequency generating means is used for a reference frequency.

14. A stably supplying method of a reference frequency recited in claim 10, wherein said method further comprises:

measuring reception quality of a reception signal; and comparing reception quality stored in advance with said measured reception quality, and said step of determining whether or not said predetermined prescribed value is met and steps subsequent to this step are conducted only in case that, with regard to a comparison result of said reception quality, said measured reception quality is worse than said reception quality stored in advance, and an output signal from said reference frequency generating means is used for a reference frequency, and in case that said measured reception quality is better than said reception quality stored in advance, and an output signal from the high-accurate reference frequency generating means is used for a reference frequency.

15. A stably supplying method of a reference frequency in a portable telephone apparatus characterized in that said method comprises:

providing reference frequency generating means capable of changing an output frequency for communication with a base station by means of a voltage control signal, and high-accurate reference frequency generating means in which frequency accuracy always meets a prescribed value;

comparing an output signal after an AFC operation of said reference frequency generating means with an output signal from said high-accurate reference frequency generating means;

determining whether or not frequency accuracy of an output signal after an AFC operation of said reference frequency generating means meets said prescribed value, based on a result of said comparison;

selecting an output signal from said reference frequency generating means in case that a result of said determination meets said prescribed value, and selecting an output signal from said high-accurate reference frequency generating means in case that a determination result of said determination means does not meet said prescribed value;

turning off a power supply of said high-accurate reference frequency generating means in case that an output signal from said high-accurate reference frequency generating means is used for a reference frequency and other than a case in which an output signal from said high-accurate reference frequency generating means is used in said comparison; and turning off a power supply of said reference frequency generating means in case that an output signal from said high-accurate reference frequency generating means is used for a reference frequency and other than a time period during which an AFC operation is conducted.

16. A stably supplying method of a reference frequency recited in claim 15, wherein said method further comprises:

measuring RSSI based on a reception signal; and comparing a predetermined RSSI threshold value stored in advance with said measured RSSI measurement value, and said determining whether or not said predetermined prescribed value is met and steps subsequent to this step are conducted only in case that, with regard to a comparison result of said RSSI, said RSSI measurement value is smaller than said RSSI threshold value, and an output signal from said reference frequency generating means is used for a reference frequency, and in case that said RSSI measurement value is larger than said RSSI threshold value, and an output signal from the high-accurate reference frequency generating means is used for a reference frequency.

17. A stably supplying method of a reference frequency recited in claim 15, wherein said method further comprises:

measuring reception quality of a reception signal; and comparing reception quality stored in advance with said measured reception quality, and said determining whether or not said predetermined prescribed value is met and steps subsequent to this step are conducted only in case that, with regard to a comparison result of said reception quality, said measured reception quality is worse than said reception quality stored in advance, and an output signal from said reference frequency generating means is used for a reference frequency, and in case that said measured reception quality is better than said reception quality stored in advance, and an output signal from the high-accurate reference frequency generating means is used for a reference frequency.

* * * * *